United States Patent
Bianco et al.

(10) Patent No.: US 11,531,066 B2
(45) Date of Patent: Dec. 20, 2022

(54) DIAGNOSTIC SOLUTIONS FOR MEDIUM VOLTAGE SWITCHING APPARATUSES

(71) Applicant: ABB Schweiz AG, Baden (CH)

(72) Inventors: Andrea Bianco, Sesto San Giovanni (IT); Andrea Ricci, Dalmine (IT); Elisabeth Lindell, Västerås (SE); Stefan Halén, Västerås (SE); Fabio Mannino, Curno (IT)

(73) Assignee: ABB SCHWEIZ AG, Baden (CH)

( * ) Notice: Subject to any disclaimer, the term of this patent is extended or adjusted under 35 U.S.C. 154(b) by 264 days.

(21) Appl. No.: 16/887,398

(22) Filed: May 29, 2020

(65) Prior Publication Data

US 2020/0379046 A1 Dec. 3, 2020

(30) Foreign Application Priority Data

May 29, 2019 (EP) .................. 19177280

(51) Int. Cl.
  *H01H 3/32* (2006.01)
  *H02B 1/04* (2006.01)
  *G01R 31/327* (2006.01)

(52) U.S. Cl.
  CPC ......... *G01R 31/3274* (2013.01); *H01H 3/32* (2013.01); *H02B 1/04* (2013.01)

(58) Field of Classification Search
  CPC .... G01R 31/3274; G01R 31/333; H01H 3/32; H01H 3/26; H01H 2003/266;
  (Continued)

(56) References Cited

U.S. PATENT DOCUMENTS 9,502,959 B2 * 11/2016 Juvonen ............... G01R 21/00
9,899,161 B2 *  2/2018 Bianco ................. H01H 9/56
(Continued)

FOREIGN PATENT DOCUMENTS

DE      19817942 A1    10/1999
EP       0974993 A2     1/2000
(Continued)

OTHER PUBLICATIONS

European Patent Office, Extended Search Report issued in corresponding Application No. 19177280.5, dated Nov. 26, 2019, 8 pp.

*Primary Examiner* — William A Bolton
(74) *Attorney, Agent, or Firm* — Armstrong Teasdale LLP

(57) ABSTRACT

The invention relates to a control unit for a medium voltage switching apparatus. The control unit is adapted to carry out a diagnostic method to check operating conditions of one or more components of said electric poles. The diagnostic method includes the following steps: basing on a selected ideal position curve, obtaining one or more first curves indicative of an ideal behaviour of said switching apparatus, during an opening manoeuvre or closing manoeuvre of the switching apparatus; basing on detection signals provided by a closed-loop control arrangement of said control unit, calculating one or more second curves indicative of an actual behaviour of said switching apparatus, during an opening manoeuvre or closing manoeuvre of said switching apparatus; and carrying out a comparison procedure among said first and second curves.

20 Claims, 9 Drawing Sheets

(58) Field of Classification Search
CPC ......... H01H 11/0062; H01H 2071/006; H01H 33/59; H02B 1/04
USPC ........................................ 324/415, 424, 423
See application file for complete search history.

(56) References Cited

U.S. PATENT DOCUMENTS

| | | | | |
|---|---|---|---|---|
| 10,141,143 | B2* | 11/2018 | Bock | H01H 50/86 |
| 2004/0179318 | A1 | 9/2004 | Hashimoto et al. | |
| 2012/0280691 | A1* | 11/2012 | Lalonge | H02H 7/222 |
| | | | | 324/424 |
| 2018/0033567 | A1* | 2/2018 | De Natale | H01H 9/167 |
| 2018/0174768 | A1* | 6/2018 | Remy | H01H 47/002 |

FOREIGN PATENT DOCUMENTS

| | | |
|---|---|---|
| EP | 3358587 A1 | 8/2018 |
| WO | 2012020187 A1 | 2/2012 |
| WO | 2012104880 A1 | 8/2012 |

* cited by examiner

DIAGNOSTIC SOLUTIONS FOR MEDIUM VOLTAGE SWITCHING APPARATUSES

The present invention relates to the field of switching apparatuses for medium voltage electric systems.

For the purpose of the present application, the term "medium voltage" (MV) relates to operating voltages at electric power distribution level, which are higher than 1 kV AC and 2 kV DC up to some tens of kV, e.g. up to 72 kV AC and 100 kV DC.

As is known, MV electric systems typically include switching apparatuses, for example circuit breakers or disconnectors, contactors, and the like.

Most recent switching apparatuses employ driving systems for moving the movable contacts, which include electric motors with an inner control loop, e.g. servomotors.

In general, these apparatuses represent an important improvement with respect to traditional spring operated or magnetically operated switching apparatuses since they can offer a much higher degree of control of the motion of the movable contacts.

However, even in these apparatuses, friction phenomena, wear phenomena, changes in operational conditions of the components, deterioration phenomena at the vacuum bulbs (in switching apparatuses of the vacuum operating type), and the like have a strong influence on the performances of the switching apparatus, during an opening manoeuvre or a closing manoeuvre. In order to mitigate these issues, suitable dedicated sensing circuits or devices are generally arranged in the electric poles in order to check operating conditions of suitable internal components of the electric poles (e.g. the electric contacts).

However, these arrangements often entail a remarkable increase of the overall size of the switching apparatus and higher manufacturing costs.

In the state of the art, it is quite felt the need for innovative diagnostic solutions that allow checking the operating conditions of internal components of the electric poles without the need of dedicated cumbersome sensing arrangements.

The present invention intends to respond to these needs by providing a control unit for a MV switching apparatus, according to the following claim 1 and the related dependent claims.

The switching apparatus comprises one or more electric poles, each electrically coupleable with a corresponding electric line.

The switching apparatus comprises:
for each electric pole, a fixed contact and a movable contact. Said movable contact is reversibly movable between a decoupled position from said fixed contact and a coupled position with said fixed contact. Said movable contact moves from said decoupled position to said coupled position during a closing manoeuvre of the switching apparatus. Said movable contact moves from said coupled position to said decoupled position during an opening manoeuvre of the switching apparatus;
a servomotor unit including at least a servomotor and adapted to provide a servomotor status signal indicative of the operating conditions of said at least a servomotor (e.g. a signal indicative of the angular position of the rotor of said at least a servomotor);
a motion transmission assembly adapted to mechanically couple said servomotor unit with the movable contacts of said one or more electric poles.

The control unit of the invention is adapted to carry out a diagnostic method to check the operating conditions of one or more components of said electric poles.

Said diagnostic method comprises the following steps:
basing on a selectable ideal position curve, calculating one or more first curves indicative of an ideal behaviour of said switching apparatus, during an opening manoeuvre or closing manoeuvre of the switching apparatus;
basing on detection signals provided by a closed-loop control arrangement of said control unit by processing said servomotor status signal, calculating one or more second curves indicative of an actual behaviour of said switching apparatus, during an opening manoeuvre or closing manoeuvre of said switching apparatus;
carrying out a comparison procedure among said first and second curves.

In a further aspect, the present invention relates to a diagnostic method to check the operating conditions of one or more components of one or more electric poles of a medium voltage switching apparatus, according to the following claim 13 and the related dependent claims.

The switching apparatus comprises:
for each electric pole, a fixed contact and a movable contact. Said movable contact is reversibly movable between a decoupled position from said fixed contact and a coupled position with said fixed contact. Said movable contact moves from said decoupled position to said coupled position during a closing manoeuvre of the switching apparatus. Said movable contact moves from said coupled position to said decoupled position during an opening manoeuvre of the switching apparatus;
a servomotor unit including at least a servomotor and adapted to provide a servomotor status signal indicative of the operating conditions of said at least a servomotor (e.g. a signal indicative of the angular position of the rotor of said at least a servomotor);
a motion transmission assembly adapted to mechanically couple said servomotor unit with the movable contacts of said one or more electric poles;
a control unit to control the operation of said switching apparatus.

Said diagnostic method comprises the following steps:
basing on a selectable ideal position curve, calculating one or more first curves indicative of an ideal behaviour of said switching apparatus, during an opening manoeuvre or closing manoeuvre of the switching apparatus;
basing on detection signals provided by a closed-loop control arrangement of said control unit, calculating one or more second curves indicative of an actual behaviour of said switching apparatus, during an opening manoeuvre or closing manoeuvre of said switching apparatus;
carrying out a comparison procedure among said first and second curves.

In further aspect, the present invention relates to a MV switching apparatus according to the following claim 13.

Characteristics and advantages of the invention will emerge from the description of preferred, but not exclusive embodiments of the control unit, according to the invention, non-limiting examples of which are provided in the attached drawings, wherein.

Figure 1:
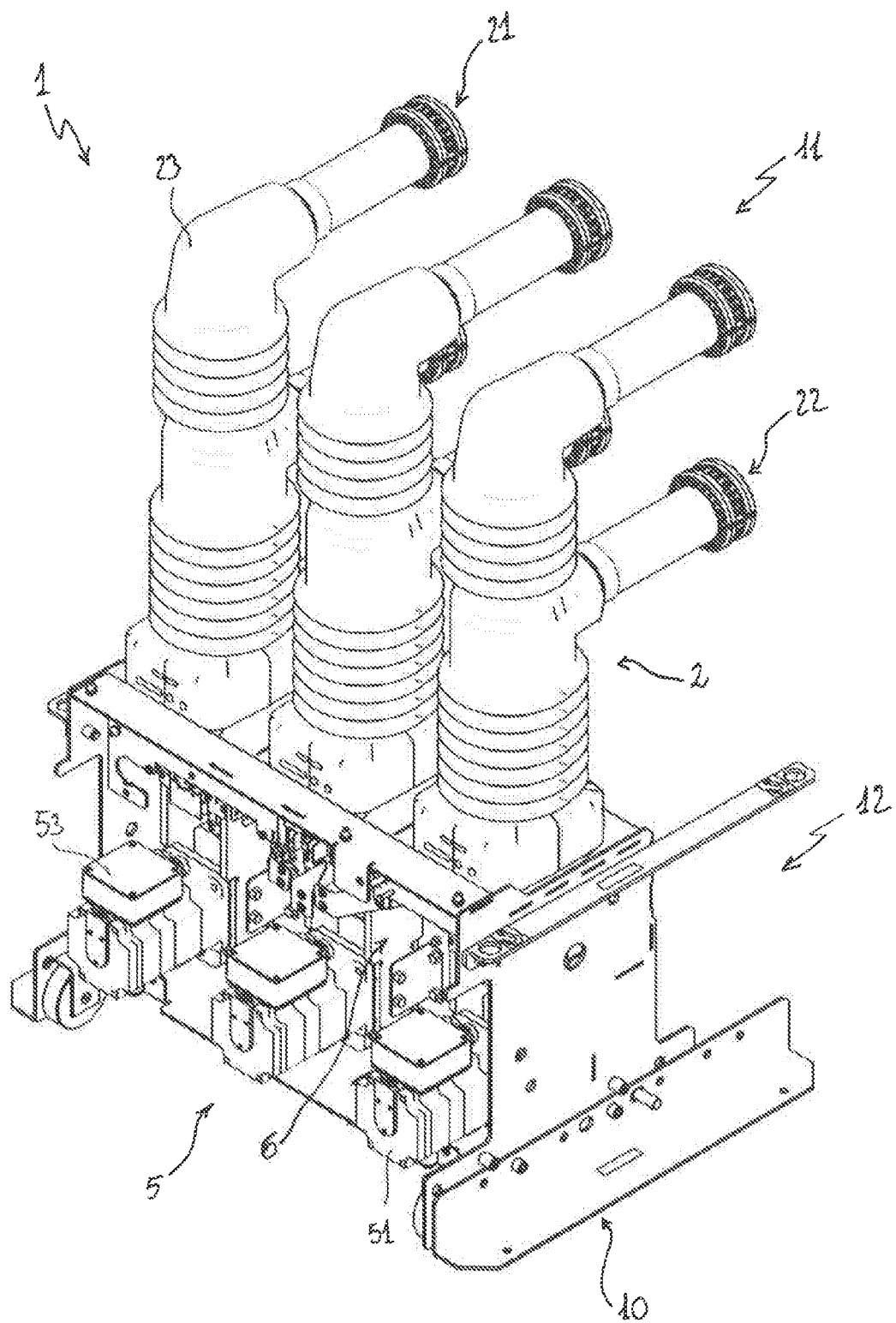
FIGS. 1-3 are schematic views of a MV switching apparatus controlled by the control unit, according to the invention.

With reference to the figures, an aspect of the present invention relates to a control unit 7 for a medium voltage (MV) switching apparatus 1.

The control unit 7 is adapted to manage the operation of the switching apparatus 1.

In principle, the control unit 7 may be formed by any Intelligent Electronic Device (IED) suitably configured to carry out control functionalities, such as protection functionalities, monitoring functionalities communication functionalities and the like.

As an example, the control unit 7 may be a protection relay or controller for electric power grids or apparatuses.

Conveniently, the control unit 7 comprises computerized unit means (which may include suitable digital processing resources, e.g. one or more microprocessors or digital signal processors) adapted to receive and execute software instructions in order to carry out the foreseen control functionalities, implement suitable control arrangements, receive, process and provide data signals and/or control signals, and the like.

The control unit 7 may be arranged on board the switching apparatus 1 or it may be provided remotely with respect to this latter.

The control unit 7 may be an autonomous computerised device and it may be implemented on a suitable computerised platform suitably configured to manage a smart power grid. As an example, such a computerised platform may be implemented on suitable dedicated servers or at cloud computing level.

In principle, the MV switching apparatus 1 may be of any type suitable for installation in power grids, for example a circuit breaker, a disconnector, a contactor, or another device of similar type.

Preferably, the switching apparatus 1 is of the vacuum operating type, as shown in the cited figures. However, according to alternative embodiments (not shown), the switching apparatus 1 may be of an air-insulated type or gas-insulated type (with reference to the insulating medium between the electric contacts).

According to a general definition, the switching apparatus 1 comprises a pole section 11 and a basement 12, which respectively include the electric poles 2 and the main actuation components 5, 6 of the switching apparatus.

Figure 2:
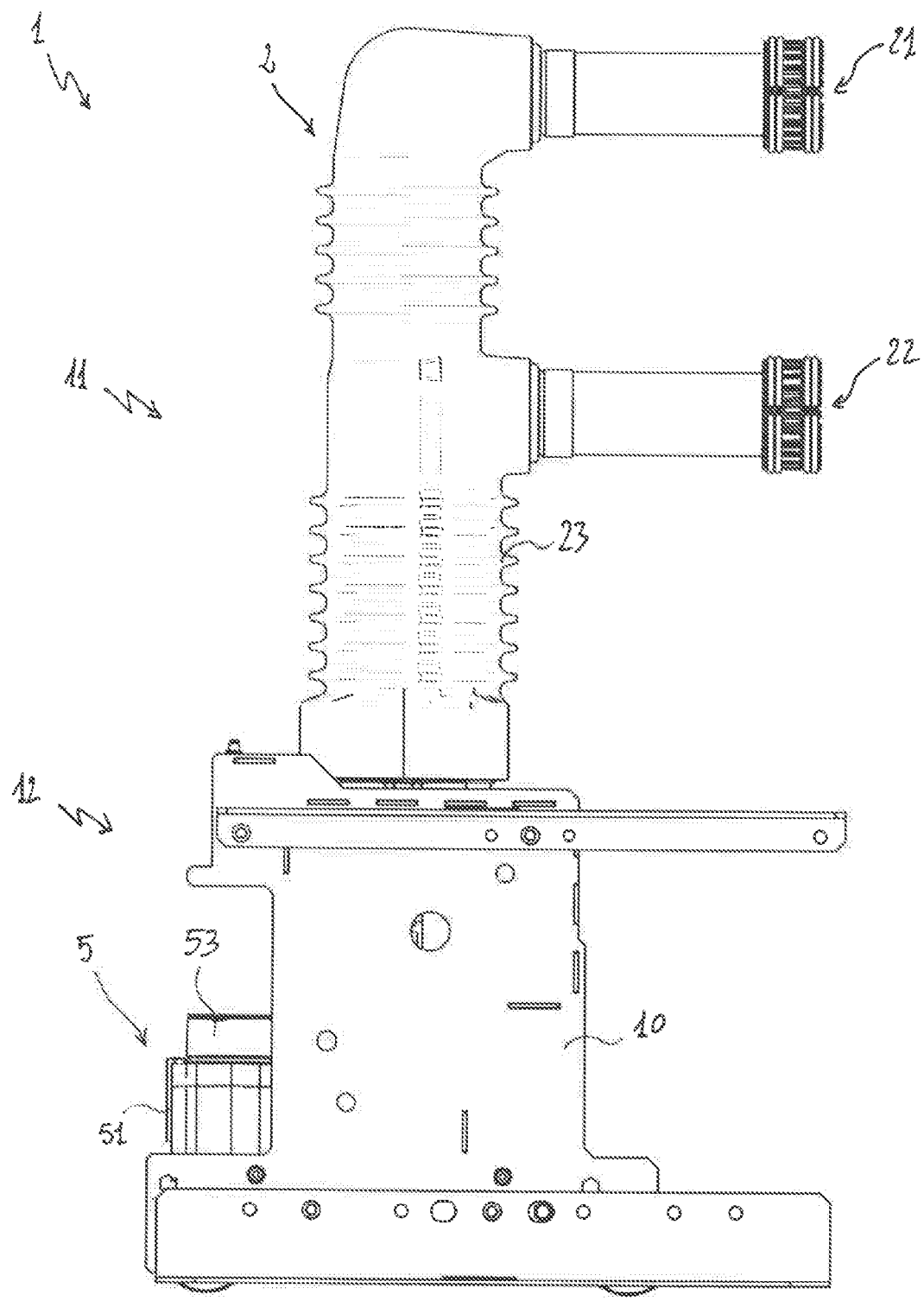
Figure 3:
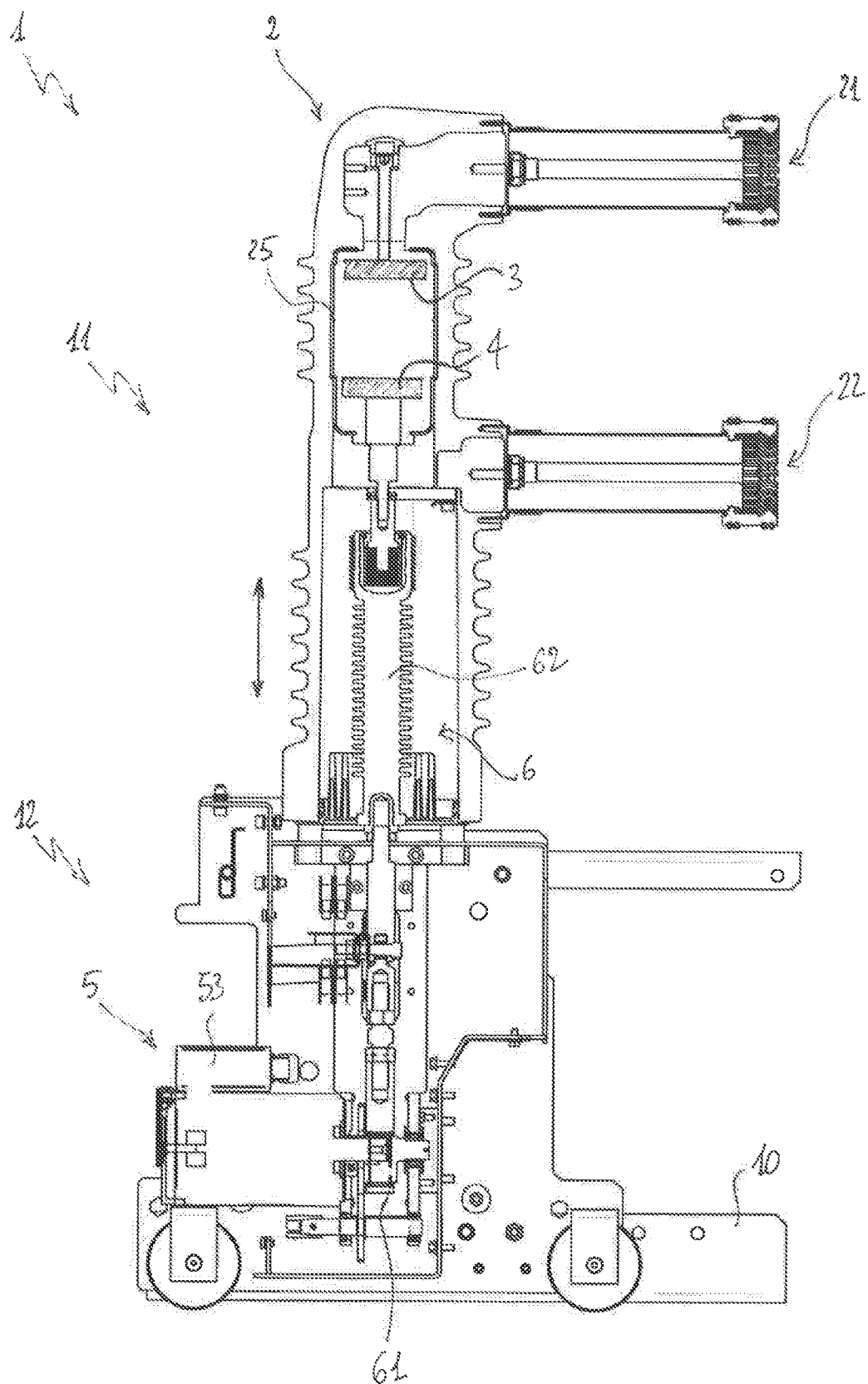

Taking as a reference a normal installation position of the switching apparatus 1, shown in FIGS. 1-3, the pole section 11 is overlapped to the basement 12.

Conveniently, the switching apparatus 1 comprises an outer frame 10, which may at least be partially made of electrically insulating material of known type.

The switching apparatus 1 comprises one or more electric poles 2.

Preferably, the switching apparatus 1 is of the multi-phase (e.g. three-phase) type and it thereby comprises a plurality (e.g. three) of electric poles 2.

However, according to alternative embodiments (not shown), the switching apparatus 1 may be of the single-phase type and include a single electric pole.

Preferably, each electric pole 2 comprises a corresponding insulating housing 23, which is conveniently fixed to the basement 12 of the switching apparatus.

Preferably, each insulating housing 23 is formed by an elongated (e.g. cylindrical) hollow body of electrically insulating material of known type.

Preferably, each insulating housing 23 defines an internal volume, in which the components of the corresponding electric pole 2 are accommodated.

Advantageously, each electric pole 2 comprises a first pole terminal 21 and a second pole terminal 22, which may be mechanically fixed to the housing 23 by means of suitable flanges.

The pole terminals 21, 22 are adapted to be electrically connected with a corresponding electric conductor (e.g. a phase conductor) of an electric line.

For each electric pole 2, the switching apparatus 1 comprises a fixed contact 3 and a movable contact 4, which are in electrical connection with the first and second pole terminals 21, 22 respectively.

Each movable contact 4 is reversibly movable along a corresponding displacement axis, which conveniently forms the main longitudinal axis of the corresponding electric pole 2.

Preferably, the displacement axes of the movable contacts 4 are mutually parallel and lye on a common displacement plane.

In particular, each movable contacts 4 is reversibly movable (see the corresponding bidirectional displacement arrow FIG. 3) between a decoupled position (open position) from the corresponding fixed contact 3 and a coupled position (closed position) with the corresponding fixed contact 3.

The passage of the movable contacts 4 from said coupled position to said decoupled position represents an opening manoeuver of the switching apparatus 1 whereas the passage of the movable contacts 4 from said decoupled position to said coupled position represents a closing manoeuver of the switching apparatus 1.

Preferably, the switching apparatus 1 is of the vacuum operating type as shown in the cited figures. In this case, for each electric pole 2, the switching apparatus 1 comprises a vacuum bulb 25, in which a corresponding pair of movable and fixed contacts 3, 4 is placed and can be mutually coupled/decoupled.

The switching apparatus 1 comprises a servomotor unit 5 providing actuation forces to actuate the movable contacts 4.

The servomotor unit 5 comprises, for each electric pole, at least a servomotor motor 51 having its output shaft operatively coupled to the corresponding movable contact 4 of the electric pole.

In alternative embodiments of the invention (not shown), however, the above-mentioned servomotor unit may comprise a single servomotor having its output shaft mechanically coupled to all the movable contacts 4 of the electric poles.

Conveniently, the servomotor unit 5 is capable of providing a servomotor status signal OD indicative of the operating conditions of the one or more servomotors, for example of the angular position of the rotors of said one or more servomotors 51.

Preferably, the servomotor unit 5 comprises, for each servomotor 51, a power and control unit 53.

Preferably, each power and control unit 53 comprises suitable electric circuits to feed the corresponding electric motor 50 and suitable electronic circuits (e.g. including one or more digital processing unit, such as microprocessors) to control operation of the corresponding servomotor 51, for example in response to suitable servomotor regulation signal CS received from the control unit 7.

The switching apparatus 1 comprises a motion transmission assembly 6 adapted to operatively couple the servomotor unit 5 with the movable contacts 4 of the electric poles 2.

Preferably, the motion transmission assembly 6 comprises, for each electric pole 2, an eccentric motion transmission mechanism 61 conveniently arranged in such a way to be actuated by rotational mechanical forces provided by a corresponding servomotor 51 and transmit, in turn, translational mechanical forces to actuate the movable contact 4 of the corresponding electric pole 2 during an opening manoeuvre or a closing manoeuvre of the switching apparatus.

Preferably, the motion transmission assembly 6 further comprises, for each electric pole 2, a motion transmission mechanism 62 arranged in such a way to be actuated by translational mechanical forces provided by the corresponding eccentric mechanism 61 and transmit, in turn, translational mechanical forces to the movable contact 4 of the corresponding electric pole 2 during an opening manoeuvre or a closing manoeuvre of the switching apparatus.

In general, the electric poles 2, the servomotor unit 5 and the motion transmission assembly 6 may be of known type and they will not here be described in more details for the sake of brevity.

As an example, they may be configured and operate as in the switching apparatus disclosed in the European patent application nr. EP17154638.5.

Preferably, the control unit 7 of the switching apparatus 1 comprises a first control arrangement 71 adapted to provide supervising control functionalities to control the operation of said switching apparatus.

Conveniently, the first control arrangement 71 is adapted to provide a position reference signal $P_R$ indicative of a reference position for the movable contacts 4 during an opening manoeuvre or a closing manoeuvre of said switching apparatus.

The first control arrangement 71 is adapted to calculate the position reference signal $P_R$ by selecting and processing an ideal position curve $C_{IP}$ indicative of a desired position profile for the movable contacts 4 during an opening manoeuvre or a closing manoeuvre of the switching apparatus.

Preferably, the first control arrangement 71 selects said ideal position reference curve $C_{IP}$ from a set of predefined ideal position curves stored in a library 78 of the control unit 7.

Such a selection process may occur depending on command signals received by the control unit 7 (e.g. from a suitable HMI or remote computerised device) or basing on a predetermined selection order that takes into account the type of the switching apparatus.

Preferably, the control unit 7 comprises a second control arrangement 72 adapted to provide closed-loop control functionalities of the operation of the switching apparatus.

Control functionalities provided by the second control arrangement 72 are basically directed to ensure a stable and precise control of the operation of the switching apparatus.

In order to provide said control functionalities, the second control arrangement 72 conveniently includes a plurality of nested closed-loop control modules 721, 722, 723, 724, 725 to control at least the position and the speed of said movable contacts 4.

The second control arrangement 72 is adapted to receive the position reference signal $P_R$ and the servomotor status signal $\theta_D$ provided by the first control arrangement 71 and by the servomotor unit 5, respectively.

Basing on the servomotor status signal $\theta_D$, the second control arrangement 72 is adapted to calculate one or more detection signals $P_F$, $v_F$, $T_F$ indicative of an actual behaviour of the movable contacts 4, during an opening manoeuvre or a closing manoeuvre of the switching apparatus.

Basing on the position reference signal $P_R$ and on the detection signals $P_F$, $v_F$, $T_F$, the second control arrangement 72 is adapted to calculate and provide a servomotor regulation signal CS to control the operation of the servomotor unit 5.

Preferably (as shown in the cited figures), the control unit 7 comprises a third control arrangement 73 adapted to provide feed-forward control functionalities of the operation of the switching apparatus.

Control functionalities provided by the third control arrangement 73 are basically directed to improve the response time in controlling the operation of the switching apparatus by improving the dynamic behaviour of the second control arrangement 72.

In order to provide said control functionalities, the third control arrangement 73 conveniently interacts with the second control arrangement 72 to adjust one or more signals (e.g. reference signals $T_{R1}$, $v_{R1}$) calculated and provided by one or more of the nested closed-loop control modules 721, 722, 723, 724, 725.

The third control arrangement 73 is adapted to receive and process the position reference signal $P_R$ provided by the first control arrangement 71.

Basing on this signal received in input, the third control arrangement 73 is adapted to calculate and provide an adjustment signal FF.

The adjustment signal FF is received by the second control arrangement 72 and it is used by this latter to adjust one or more regulation signals or reference signals $T_{R1}$, $v_{R1}$ calculated by said closed-loop control modules.

Figure 4:
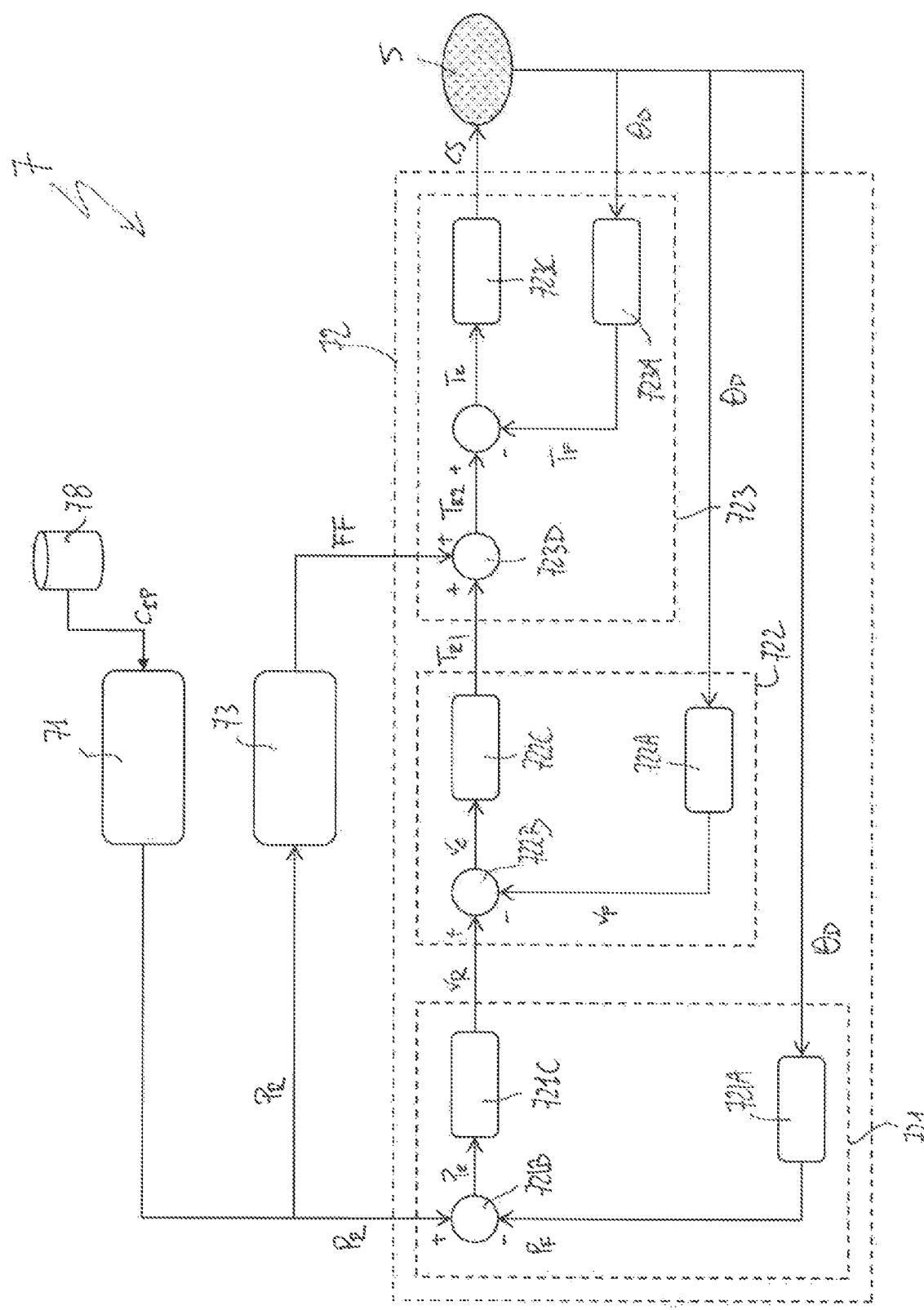
FIGS. 4-5 are schematic views of the control unit, according to different embodiments of the invention.

In FIG. 4, an embodiment of the control unit 7 is schematically shown.

According to such an embodiment, the second control arrangement 72 comprises three nested closed-loop control modules 721, 722, 723 to control position, speed and actuation force of the movable contacts 4 during an opening manoeuvre or a closing manoeuvre of the switching apparatus.

Preferably, the second control arrangement 72 comprises a first closed-loop control module 721, which is directed to control the position of the movable contacts 4 during an opening manoeuvre or a closing manoeuvre of the switching apparatus.

In particular, during an opening manoeuvre or a closing manoeuvre of the switching apparatus, the second closed-loop control module 722 is adapted to process the position reference signal $P_R$ provided by the first control arrangement 71 and the servomotor status signal $\theta_D$ provided by the servomotor unit 5 and provide a speed reference signal $v_R$ for an inner closed-loop control module.

During an opening manoeuvre or a closing manoeuvre of the switching apparatus, the first closed-loop control module 721 receives the position reference signal $P_R$ and the servomotor status signal $\theta_D$.

The first closed-loop control module 721 calculates a position detection signal $P_F$ indicative of the actual position of the movable contacts 4 basing on the servomotor status signal $\theta_D$.

To this aim, the first closed-loop control module 721 comprises a calculation block 721A adapted to receive and process the servomotor status signal $\theta_D$ and provide the position detection signal $P_F$.

The first closed-loop control module 721 calculates a position error signal $P_e$ indicative of the difference between the position reference signal $P_R$ and the position detection $P_F$.

To this aim, the first closed-loop control module 721 comprises another calculation block 721B adapted to receive and process the position reference signal $P_R$ and the position detection signal $P_D$ and provide the position error signal $P_e$.

The first closed-loop control module 721 calculates a speed reference signal $v_R$ indicative of a reference speed for the movable contacts 4.

To this aim, the first closed-loop control module 721 comprises a regulation block 721C adapted to receive and process the position error signal $P_e$ and provide the speed reference signal $v_R$.

Preferably, the second control arrangement 72 comprises a second closed-loop control module 722, which is directed to control the speed of the movable contacts 4 during an opening manoeuvre or a closing manoeuvre of the switching apparatus.

In particular, during an opening manoeuvre or a closing manoeuvre of the switching apparatus, the second closed-loop control module 722 is adapted to process the speed reference signal $v_R$ provided by the first closed-loop control module 72 and the servomotor status signal $\theta_D$ provided by the servomotor unit 5 and provide a first actuation force reference signal $T_{R1}$ for an inner closed-loop control module.

During an opening manoeuvre or a closing manoeuvre of the switching apparatus, the second closed-loop control module 722 receives the speed reference signal $v_R$ and the servomotor status signal $\theta_D$.

Basing on the servomotor status signal $\theta_D$, the second closed-loop control module 722 then calculates a speed detection signal w indicative of the actual speed of the movable contacts 4.

To this aim, the second closed-loop control module 722 conveniently comprises a calculation block 722A adapted to receive and process the servomotor status signal $\theta_D$ and provide the speed detection signal $v_F$.

The second closed-loop control module 722 calculates a speed error signal $v_e$ indicative of the difference between the speed reference signal $v_R$ and the speed detection $v_F$.

To this aim, the second closed-loop control module 722 comprises another calculation block 722B adapted to receive and process the speed reference signal $v_R$ and the speed detection signal $v_F$ and provide the speed error signal $v_e$.

The second closed-loop control module 722 calculates a first actuation force reference signal $T_{R1}$ indicative of a reference actuation force to be exerted on the movable contacts 4. To this aim, the second closed-loop control module 722 comprises a regulation block 722C adapted to receive and process the speed error signal $v_e$ and provide the first actuation force reference signal $T_{R1}$.

Preferably, the second control arrangement 72 comprises a third closed-loop control module 723, which is directed to control the actuation force exerted on the movable contacts 4 during an opening manoeuvre or a closing manoeuvre of the switching apparatus.

In particular, during an opening manoeuvre or a closing manoeuvre of the switching apparatus, the third closed-loop control module 723 is adapted to process the first actuation reference signal $T_{R1}$ provided by the second control loop 722, the servomotor status signal $\theta_D$ provided by the servomotor unit 5 and the adjustment signal FF provided by the third control arrangement 73 and provide the servomotor regulation signal CS for the servomotor unit 5.

During an opening manoeuvre or a closing manoeuvre of the switching apparatus, the third closed-loop control module 723 receives the first actuation reference signal $T_{R1}$, the servomotor status signal $\theta_D$ and the adjustment signal FF.

The third closed-loop control module 723 calculates a second actuation force reference signal $T_{R2}$ indicative of an adjusted reference actuation force for said movable contacts 4.

To this aim, the third closed-loop control module 723 conveniently comprises a calculation block 723D adapted to receive and process the first actuation force reference signal $T_{R1}$ and the adjustment signal FF and provide the second actuation force reference signal $T_{R2}$. Conveniently, the second actuation reference signal $T_{R2}$ is calculated in such a way to improve the overall time response of the second control arrangement 72 to possible variations of the position reference signal $P_R$ or possible variation of the operating conditions of movable contacts 4 (as indicated by the servomotor status signal $\theta_D$).

Basing on the servomotor status signal $\theta_D$, the third closed-loop control module 723 calculates an actuation force detection signal $T_F$ indicative of the actual actuation force exerted on the movable contacts 4.

To this aim, the third closed-loop control module 723 conveniently comprises another calculation block 723A adapted to receive and process the servomotor status signal $\theta_D$ and provide the actuation force detection signal $T_F$.

The third closed-loop control module 723 calculates an actuation force error signal $T_e$ indicative of the difference between the second actuation force reference signal $T_{R2}$ and the actuation force detection $T_F$.

To this aim, the third closed-loop control module 723 conveniently comprises another calculation block 723B adapted to receive and process the second actuation force reference signal $T_{R2}$ and the actuation force detection signal $T_F$ and provide the actuation force error signal $T_e$.

The third closed-loop control module 723 calculates the servomotor regulation signal CS to be provided to the servomotor unit 5 to control the operation thereof.

To this aim, the third closed-loop control module 723 conveniently comprises a regulation block 723C adapted to receive and process the actuation force error signal $T_e$ and provide the servomotor regulation signal CS.

Figure 5:
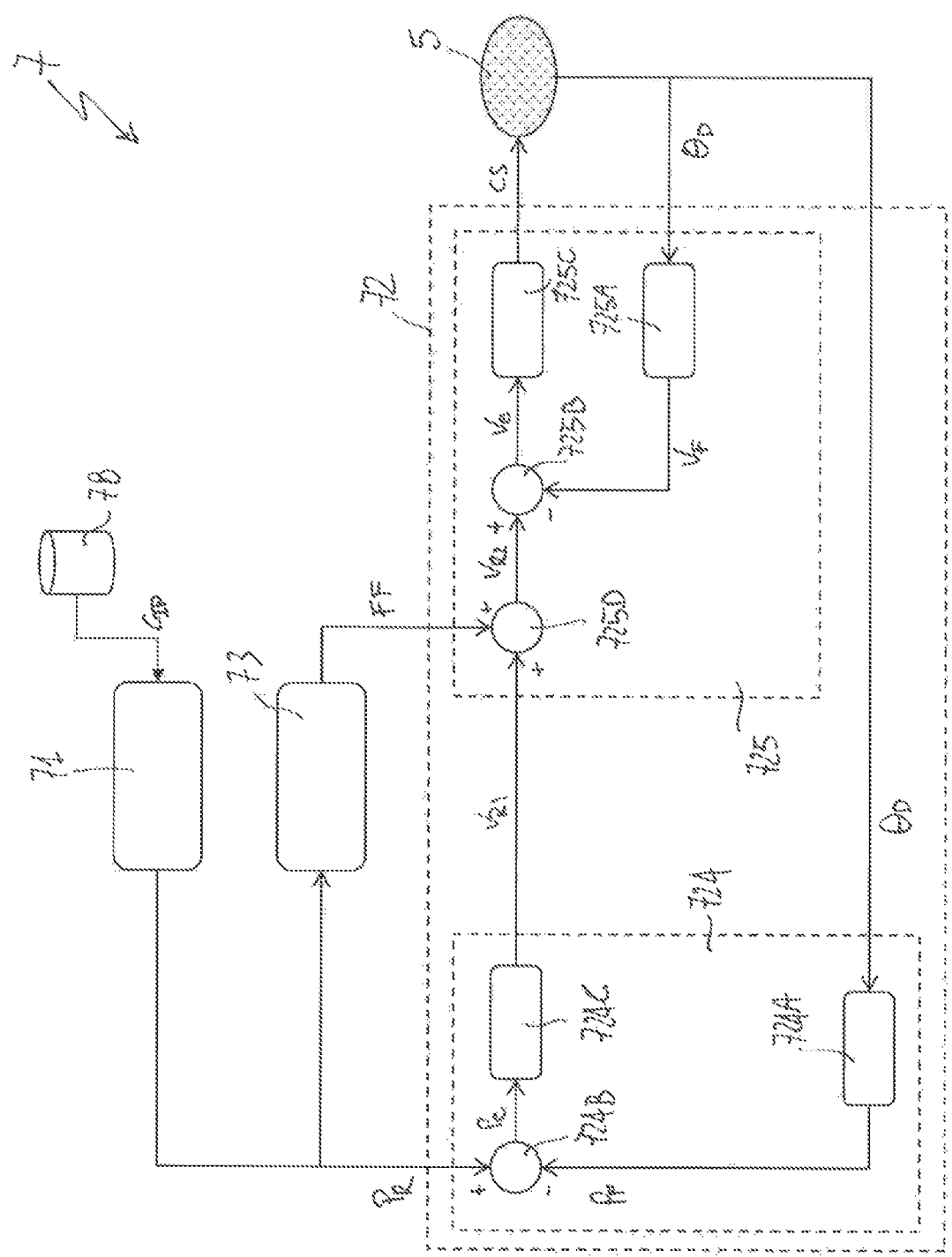

In FIG. 5, an alternative embodiment of the control unit 7 is schematically shown.

According to such an embodiment, the second control arrangement 72 comprises two nested closed-loop control modules 724, 725 to control position and speed of the movable contacts 4 during an opening manoeuvre or a closing manoeuvre of the switching apparatus.

Preferably, the second control arrangement 72 comprises a fourth closed-loop control module 724, which is directed to control the position of the movable contacts 4 during an opening manoeuvre or a closing manoeuvre of the switching apparatus.

In particular, during an opening manoeuvre or a closing manoeuvre of the switching apparatus, the fourth closed-loop control module 724 is adapted to process the position reference signal $P_R$ provided by the first control arrangement 71 and the servomotor status signal $\theta_D$ provided by the servomotor unit 5 and provide a speed reference signal vii for the inner closed-loop control module.

During an opening manoeuvre or a closing manoeuvre of the switching apparatus, the fourth closed-loop control module 724 receives the position reference signal $P_R$ and the servomotor status signal $\theta_D$.

Basing on the servomotor status signal $\theta_D$, the fourth closed-loop control module 724 calculates a position detection signal $P_F$ indicative of the actual position of the movable contacts 4.

To this aim, the fourth closed-loop control module 724 conveniently comprises a calculation block 724A adapted to receive and process the servomotor status signal $\theta_D$ and provide the position detection signal $P_F$.

The fourth closed-loop control module 724 calculates a position error signal $P_e$ indicative of the difference between the position reference signal $P_R$ and the position detection $P_F$.

To this aim, the fourth closed-loop control module 724 conveniently comprises another calculation block 724B adapted to receive and process the position reference signal $P_R$ and the position detection signal $P_F$ and provide the position error signal $P_e$.

The fourth closed-loop control module 724 calculates a first speed reference signal vii indicative of a reference speed for the movable contacts 4.

To this aim, the fourth closed-loop control module 724 conveniently comprises a regulation block 724C adapted to receive and process the position error signal $P_e$ and provide the first speed reference signal $v_{R1}$.

Preferably, the second control arrangement 72 comprises a fifth closed-loop control module 725, which is directed to control the speed of the movable contacts 4 during an opening manoeuvre or a closing manoeuvre of the switching apparatus.

In particular, during an opening manoeuvre or a closing manoeuvre of the switching apparatus, the fifth closed-loop control module 725 is adapted to process the first speed reference signal vii provided by the fourth control loop 724, the servomotor status signal $\theta_D$ provided by the servomotor unit 5 and the adjustment signal FF provided by the third control arrangement 73 and provide the servomotor regulation signal CS for the servomotor unit 5.

During an opening manoeuvre or a closing manoeuvre of the switching apparatus, the fifth closed-loop control module 725 receives the first speed reference signal $v_{R1}$, the servomotor status signal $\theta_D$ and the adjustment signal FF.

The fifth closed-loop control module 725 calculates a second speed reference signal $v_{R2}$ indicative of an adjusted reference speed for the movable contacts 4.

To this aim, the fifth closed-loop control module 725 conveniently comprises a calculation block 725D adapted to receive and process the first speed reference signal vii and the adjustment signal FF and provide the second speed reference signal $v_{R2}$.

Conveniently, the second speed signal $v_{R2}$ is calculated in such a way to improve the overall time response of the second control arrangement 72 to possible variations of the position reference signal $P_R$ or of the operating conditions of movable contacts 4 (as indirectly indicated by the servomotor status signal $\theta_D$).

Basing on the servomotor status signal $\theta_D$, the fifth closed-loop control module 725 calculates a speed detection signal w indicative of the actual speed of the movable contacts 4.

To this aim, the fifth closed-loop control module 725 conveniently comprises another calculation block 725A adapted to receive and process the servomotor status signal $\theta_D$ and provide the speed detection signal $v_F$.

The fifth closed-loop control module 725 then calculates a speed error signal $v_e$ indicative of the difference between the second (adjusted) speed reference signal $v_{R2}$ and the speed detection $v_F$.

To this aim, the fifth closed-loop control module 725 conveniently comprises another calculation block 725B adapted to receive and process the second speed reference signal $v_{R2}$ and the speed detection signal $v_F$ and provide the speed error signal $v_e$.

The fifth closed-loop control module 725 calculates the servomotor regulation signal CS to be provided to the servomotor unit 5 to control the operation thereof.

To this aim, the fifth closed-loop control module 725 comprises a regulation block 725C adapted to receive and process the speed error signal $v_e$ and provide the servomotor regulation signal CS. An essential aspect of the invention consists in that the first control arrangement 71 is adapted to carry out a diagnostic method 100 to check the operating parameters of said electric poles 2 basing one or more detection signals $P_F$, $v_F$, $T_F$ indicative of the actual behaviour of the movable contacts 4 during an opening manoeuvre or a closing manoeuvre of the switching apparatus.

According to the invention, such detection signals $P_F$, $v_F$, $T_F$ are provided by one or more closed-loop control modules 721, 722, 723, 724, 725 of the second control arrangement 72 and are calculated by said closed-loop control modules basing on the servomotor status signal $\theta_D$ provided by the servomotor unit 5.

Obviously, the first control arrangement 71 is adapted to provide additional control functionalities that may be of known type and that will not be described here for the sake of brevity. Such additional control functionalities may include grid inter-block management functionalities, communication functionalities, protection functionalities and the like.

Figure 6:
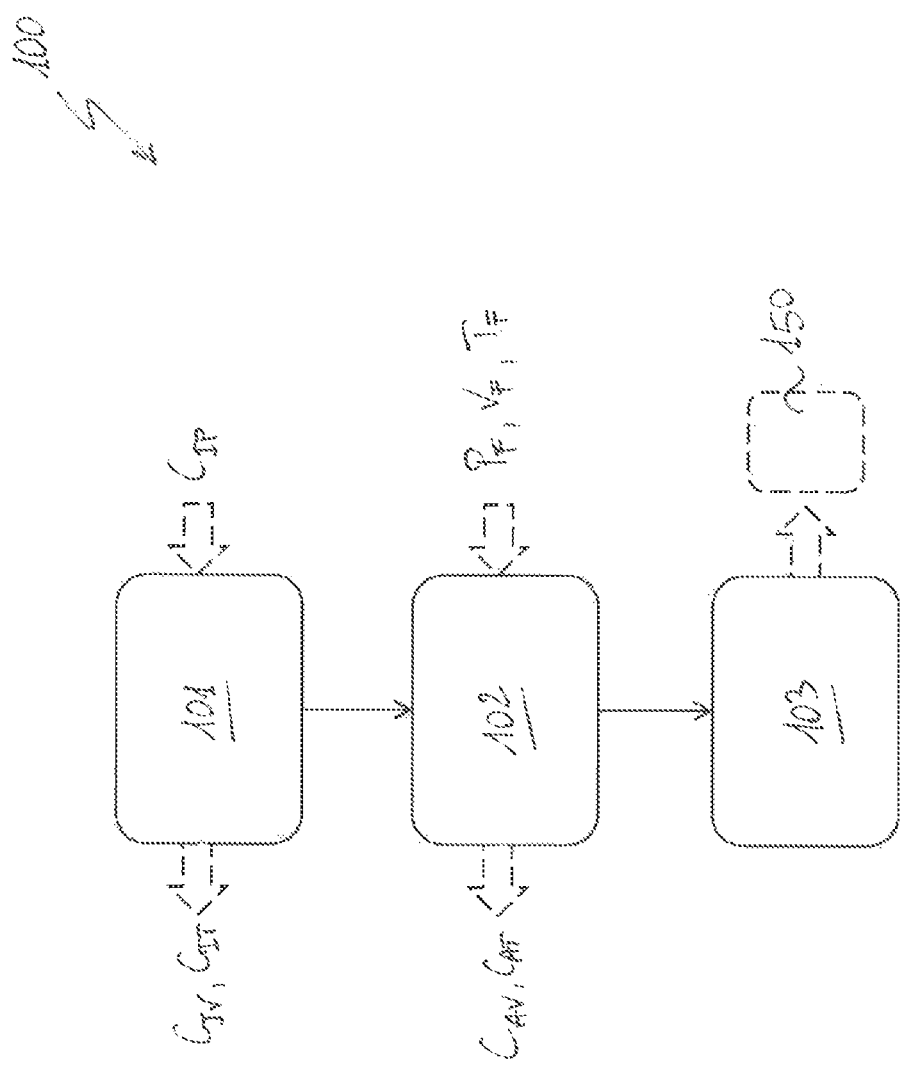
FIGS. 6-7 are schematic views illustrating a diagnostic method, according to the invention.

Hereinafter, the above-mentioned diagnostic method 100 is described in more details in accordance to a preferred embodiment of the invention (FIG. 6).

Preferably, the diagnostic method 100 comprises a step 101 of obtaining one or more first curves $C_{Iv}$, $C_{IT}$ indicative of an ideal behaviour of the switching apparatus 1, during an opening manoeuvre or closing manoeuvre of said switching apparatus.

One or more first curves (e.g. the first curves $C_{Iv}$) may be calculated basing on the above-mentioned ideal position curve $C_{IP}$ that is selected and processed by the first control arrangement 71 to calculate the position reference signal $P_R$ provided to the second and third control arrangements 72, 73.

One or more first curves (e.g. the first curves $C_{IT}$) may be predefined and they may be retrieved from a storage medium (e.g. the library 78).

Preferably, the first curves $C_{Iv}$, $C_{IT}$ obtained by the first control arrangement 71 are indicative of ideal profiles of speed of and actuation force of said movable contacts 4 during an opening manoeuvre or a closing manoeuvre of the switching apparatus 1.

In practice, the first curves $C_{Iv}$, $C_{IT}$ represent the ideal profiles of speed and actuation force that the movable contacts 4 should follow during an opening manoeuvre or a closing manoeuvre of the switching apparatus 1 carried out with the second and third control arrangements controlling the switching apparatus in such a way to follow the position reference signal $P_R$ provided by the first control arrangement 71.

Preferably, the diagnostic method 100 comprises a further step 102 of calculating one or more second curves $C_{Av}$, $C_{AT}$ indicative of an actual behaviour of the switching apparatus 1, during an opening manoeuvre or closing manoeuvre of said switching apparatus.

Preferably, the second curves $C_{Av}$, $C_{AT}$ are calculated basing on the above-mentioned detection signals $P_F$, $v_F$, $T_F$ by one or more closed-loop control modules 721, 722, 723, 724, 725 of the second control arrangement 72 and are calculated by said closed-loop control modules basing on the servomotor status signal $\theta_D$ provided by the servomotor unit 5.

Preferably, the second curves $C_{Av}$, $C_{AT}$ calculated by the first control arrangement 71 are indicative of actual profiles of speed of the movable contacts 4 and actuation force exerted on said movable contacts during an opening manoeuvre or a closing manoeuvre of the switching apparatus 1.

In practice, the second curves $C_{Av}$, $C_{AT}$ represent the actual profiles of speed and actuation force really followed by the movable contacts 4 during an opening manoeuvre or a closing manoeuvre of the switching apparatus 1 carried out with the second and third control arrangements controlling the switching apparatus in such a way to follow the position reference signal $P_R$ provided by the first control arrangement 71.

Preferably, the diagnostic method 100 comprises a further step 103 of carrying out a comparison procedure 150 among the first and second curves $C_{Iv}$, $C_{IT}$, $C_{Av}$, $C_{AT}$ to check the operating conditions of one or more components of said electric poles.

Figure 7:
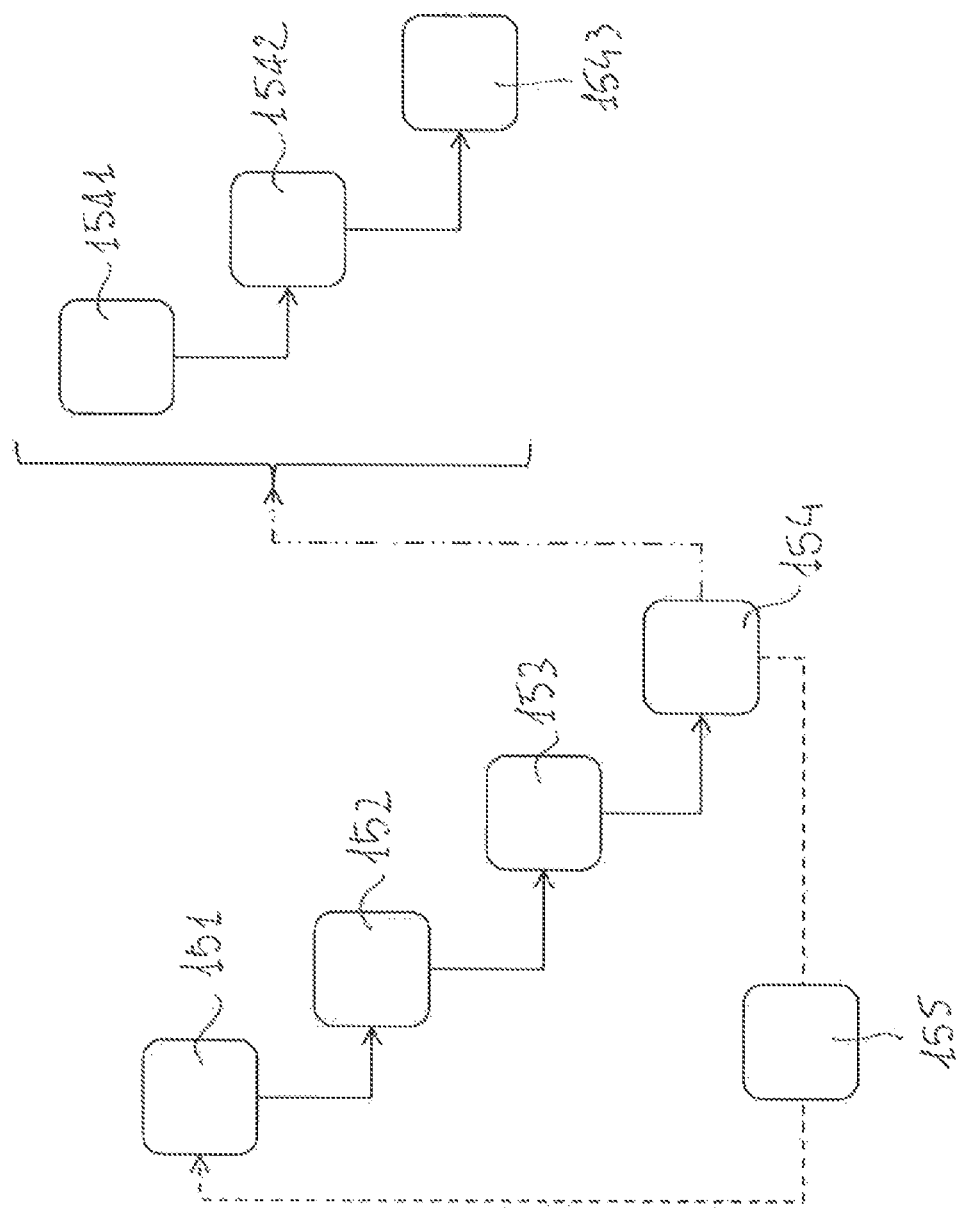

Hereinafter, the above-mentioned comparison 150 is described in more details in accordance to a preferred embodiment of the invention (FIG. 7).

Preferably, the comparison procedure 150 comprises the step 151 of selecting an operating parameter of the electric poles 2, which has to be checked.

Figure 8:
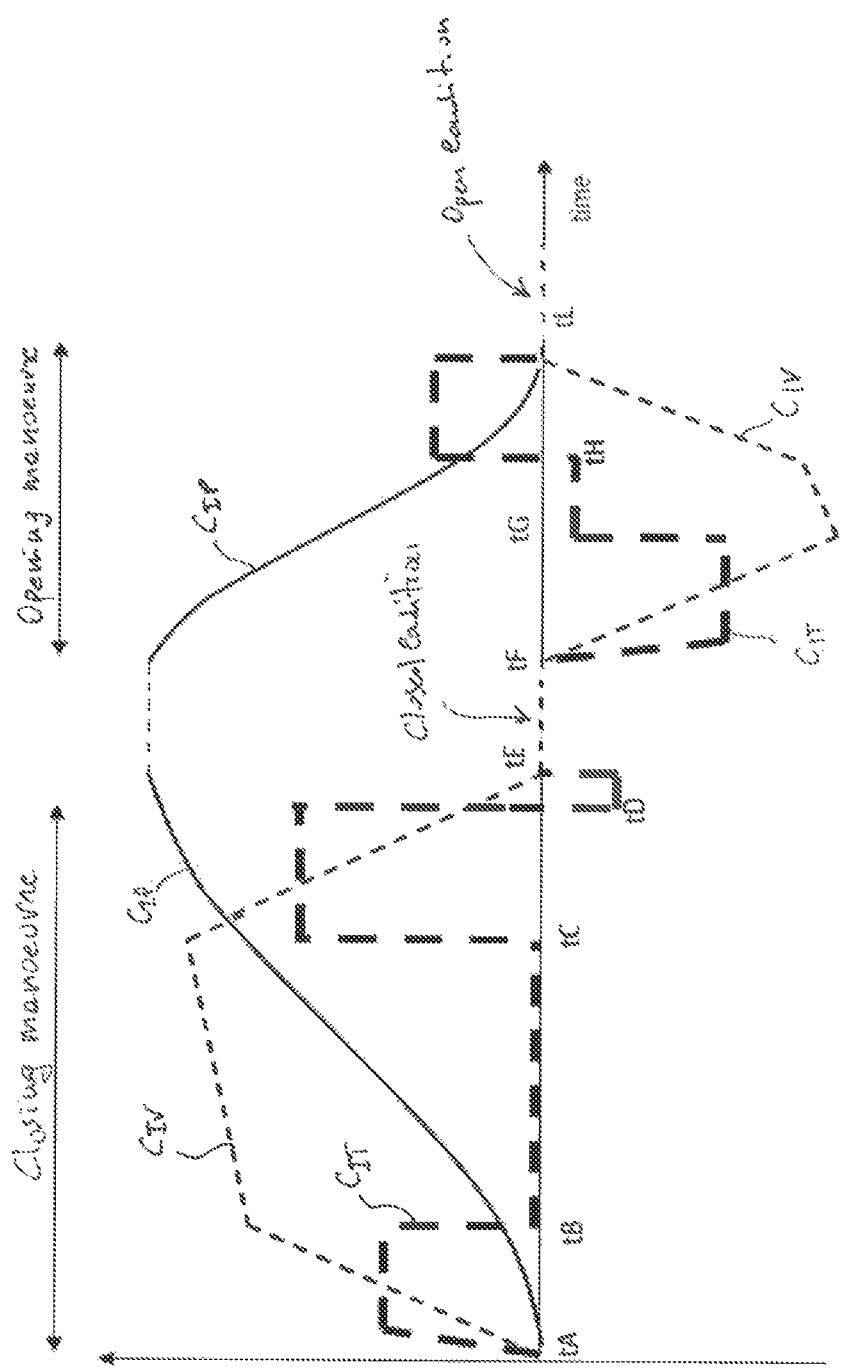
FIGS. 8-9 are schematic examples of implementation of the diagnostic method, according to the invention.
Figure 9:
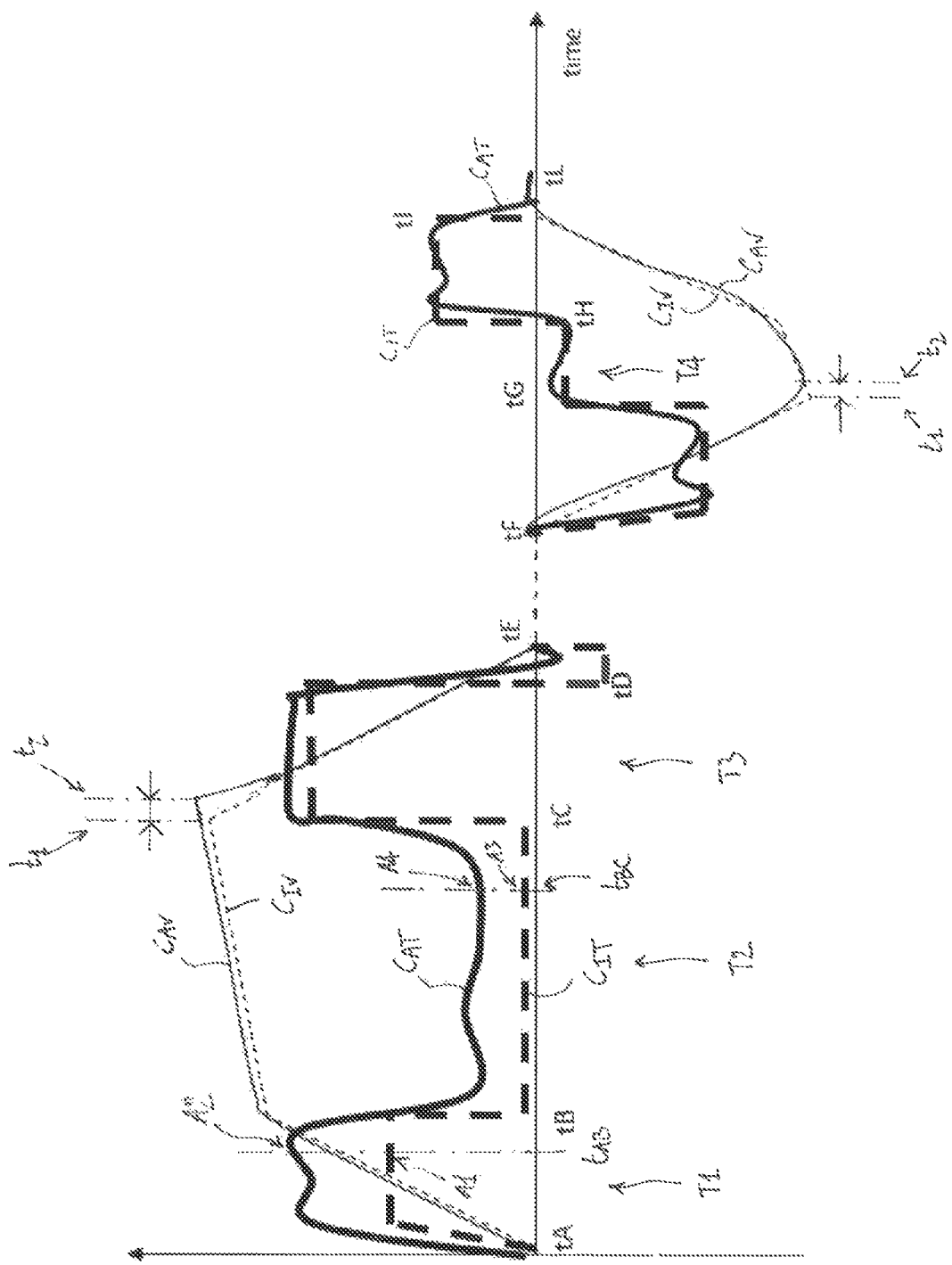

As it will be more apparent from the following examples, such an operating parameter may be the motion transmission efficiency of the motion transmission assembly 6, the erosion level of the electric contacts 3, 4 of the electric poles, and the like, in practice any suitable operating parameter that may be indicative of the operating conditions of a component of the electric pole. Preferably, the comparison procedure 150 comprises the step 152 of selecting an observation time window T1, T2, T3, T4 for the first and second curves $C_{Iv}$, $C_{IT}$, $C_{Av}$, $C_{AT}$ to check the operating conditions of the selected operating parameter (FIGS. 8-9).

The observation time windows T1-T4 are suitable time intervals that are selected depending on the nature of the selected operating parameter.

As an example a given observation time window T1 for the first and second curves $C_{Iv}$, $C_{IT}$, $C_{Av}$, $C_{AT}$ may be selected to check the motion transmission efficiency of the motion transmission assembly 6 while other observation time windows T3-T4 may be selected to check the erosion level of the electric contacts, and so on.

Preferably, the comparison procedure 150 comprises the step 153 of selecting a first curve $C_{Iv}$, $C_{IT}$ and a corresponding second curve $C_{Av}$, $C_{AT}$ to check the operating conditions of the selected operating parameter.

As an example, for a given selected operating parameter, first and second curves $C_{Iv}$, $C_{Av}$ indicative of the ideal and actual speed profiles of the movable contacts 4 may be selected while, for another selected operating parameter, first and second curves $C_{Iv}$, $C_{Av}$ indicative of the ideal and actual actuation force profiles of the movable contacts 4 may be selected.

Preferably, the comparison procedure 150 comprises the step 154 of comparing the selected first curve $C_{Iv}$, $C_{IT}$ with the corresponding selected second curve $C_{Av}$, $C_{AT}$ at the selected observation time window T1-T4.

Preferably, the comparison step 154 provides for calculating suitable variation values $\Delta_1$, $\Delta_2$, $\Delta_3$ between corresponding selected first and second characteristic values indicative of the selected operating parameter.

Preferably, the comparison step 154 comprises a sub-step 1541 of selecting a first characteristic value A1, A3, $t_1$ of the selected first curve $C_{Iv}$, $C_{IT}$ at the selected time window T1-T4.

Conveniently, the selected first characteristic value A1, A3, $t_1$ is indicative of the selected operating parameter in the selected first curve $C_{Iv}$, $C_{IT}$.

Preferably, the comparison step 154 preferably comprises a sub-step 1542 of selecting a second characteristic value A2, A4, $t_2$ of the selected second curve $C_{Av}$, $C_{AT}$ at the selected time window T1-T3.

Conveniently, the selected second characteristic value A2, A4, $t_2$ corresponds to the selected first characteristic values selected at the previous sub-step 1541 and it is indicative of the selected operating parameter in the selected second curve $C_{Av}$, $C_{AT}$.

Preferably, the comparison step 154 preferably comprises a sub-step 1543 of calculating a variation value $\Delta_1$, $\Delta_2$, $\Delta_3$ between the corresponding selected first and second characteristic values A1, $t_{C1}$, $t_{G1}$, A2, $t_{C2}$, $t_{G2}$.

Conveniently, the calculated variation value $\Delta_1$, $\Delta_2$, $\Delta_3$ may be compared with a corresponding suitable threshold level to check whether the corresponding operating parameter still falls within a normal condition or it is subject to anomalous changes. For example, such possible anomalous changes may be indicative of incoming failure conditions.

The calculated variation value $\Delta_1$, $\Delta_2$, $\Delta_3$ may also be used for obtaining quantitative measurements indicative of the erosion status of the electric contacts.

Preferably, the steps 151-154 of the comparison procedure 150 may be repeated (step 155) for another selectable operating parameter of the electric poles 2.

Referring to FIGS. 8-9, some examples of implementation of the diagnostic method 100 are here illustrated in more details with specific reference to a switching apparatus 1 of the vacuum-operating type, as shown in FIGS. 1-3.

In FIG. 8, there is shown an ideal position curve $C_{IP}$ indicative of a desired position profile for the movable contacts 4 during an opening manoeuvre or a closing manoeuvre of the switching apparatus 1.

As mentioned above, the first control arrangement 71 conveniently selects the ideal position curve $C_{IP}$ from a predefined library 78.

Basing on the ideal position curve $C_{IP}$, the first control arrangement 71 obtains first curves $C_{Iv}$, $C_{IT}$ indicative of deal profiles of speed and actuation force of the movable contacts 4 during an opening manoeuvre or a closing manoeuvre of the switching apparatus (step 101 of the diagnostic method 100).

Such a calculation is relatively easy to implement as the geometry and the cinematic behaviour of the motion transmission assembly 6, which mechanically couples the servomotor unit 5 with the movable contacts 4, is per se known.

In FIG. 9, there are shown (in addition to the above mentioned first curves $C_{Iv}$, $C_{IT}$) second curves $C_{Av}$, $C_{AT}$ indicative of the actual speed and actuation force of the switching apparatus 1, during an opening manoeuvre or closing manoeuvre of said switching apparatus carried out by following the ideal position curve $C_{IP}$ (position reference signal $P_R$).

As mentioned above, the first control arrangement 71 receives the detection signals $P_F$, $v_F$, $T_F$ that are calculated by the second control arrangement 72 while carrying out its control functionalities and, basing on said detection signals $P_F$, $v_F$, $T_F$, calculates the second curves $C_{Av}$, $C_{AT}$ (step 102 of the diagnostic method 100).

Also in this case, such a calculation is relatively easy to implement as the geometry and the cinematic behaviour of the motion transmission assembly 6, which mechanically couples the servomotor unit 5 with the movable contacts 4, is per se known.

As mentioned above (step 103 of the diagnostic method 100), the diagnostic method 100 provides for executing a comparison procedure 150 between first and second curves $C_{Iv}$, $C_{IT}$, $C_{Av}$, $C_{AT}$ respectively indicative of the ideal and actual behaviour of the switching apparatus 1 during the opening manoeuvre or closing manoeuvre carried out by following the ideal position curve $C_{IP}$ (position reference signal $P_R$).

Referring to FIG. 9, some examples of the comparison procedure 150 among the first and second curves $C_{Iv}$, $C_{IT}$, $C_{Av}$, $C_{AT}$ are here illustrated ion more details.

Example #1

The efficiency level of the motion transmission to the movable contacts 4 is assumed as the operating parameter of the electric poles 2 to be checked (step 151 of the comparison procedure 150).

As is known, such an operating parameter is generally indicative of the operating conditions of the motion transmission assembly 6, in particular of the first motion transmission mechanism 61. In order to check such an operating parameter, the first observation time window T1 between the instants $t_A$ and $t_B$ during the closing manoeuvre of the switching apparatus 1 may be selected (step 152 of the comparison procedure 150).

Additionally, first and second curves $C_{IT}$, $C_{AT}$ respectively indicative of the ideal and actual profile of the actuation force exerted on the movable contacts 4 are selected (step 153 of the comparison procedure 150).

The selected first and second curves $C_{IT}$, $C_{AT}$ are then compared at the selected observation time window T1 (step 154 of the comparison procedure 150).

In order to carry out such a comparison, corresponding first and second characteristic values A1, A2 of the first and second curve $C_{IT}$, $C_{AT}$ are selected at the observation time window T1 (sub-steps 1541-1542 of the comparison step 154).

In this case, the first and second characteristic values A1, A2 are mechanical quantities, namely a first actuation force value and a second actuation force value at a same time instant $t_{AB}$ included in the observation time window T1, respectively.

A variation value $\Delta_1$=A1−A2 between the selected first and second characteristic values A1, A2 is then calculated (sub-step 1543 of the comparison step 154).

Such a variation value may be compared with a threshold level.

A variation value $\Delta_1$ higher than such threshold level may be indicative of the circumstance that friction and backlash phenomena are playing a remarkable role in motion transmission to the movable contacts 4.

Example #2

In this example, the ratio between the vacuum force exerted by the vacuum bulb and the mechanical friction between the movable contacts 4 and the fixed contacts 4 is assumed as the operating parameter of the electric poles 2 to be checked (step 151 of the comparison procedure 150).

As is known, such an operating parameter is generally indicative of the operating conditions of the vacuum bulb and of the electric contacts 3, 4.

In order to check such an operating parameter, the second observation time window T2 between the instants $t_B$ and $t_C$ during the closing manoeuvre of the switching apparatus 1 may be selected (step 152 of the comparison procedure 150).

Additionally, first and second curves $C_{IT}$, $C_{AT}$ respectively indicative of the ideal and actual profile of the speed of the movable contacts 4 are selected (step 153 of the comparison procedure 150).

The selected first and second curves $C_{IT}$, $C_{AT}$ are then compared at the selected observation time window T2 (step 154 of the comparison procedure 150).

In order to carry out such a comparison, corresponding third and fourth characteristic values A3, A4 of the first and second curve $C_{IT}$, $C_{AT}$ are selected at the observation time window T2 (sub-steps 1541-1542 of the comparison step 154).

In this case, the first and second characteristic values A3, A4 are mechanical quantities, namely a actuation force value A3 and a second actuation force value A4 at a same time instant $t_{BC}$ included in the second observation time window T2, respectively.

A variation value $\Delta_2$=A3−A4 between the selected first and second characteristic values A3, A4 is then calculated (sub-step 1543 of the comparison step 154).

Such a variation value may be compared with a suitable threshold level.

A variation value $\Delta_2$ higher than such threshold level may be indicative of a wrong balancing condition between the vacuum force exerted by the vacuum bulb and the friction force between the electric contacts 3, 4.

Example #3

In this example, the speed of the movable contacts 4 is assumed as the operating parameter of the electric poles 2 to be checked (step 151 of the comparison procedure 150).

As is known, such an operating parameter is generally indicative of the erosion condition of the electric contacts 3, 4 and/or the force exerted by compression springs of the electric poles.

In order to check such an operating parameter, the third observation time window T3 between the instants $t_C$ and $t_D$ during the closing manoeuvre of the switching apparatus 1 or the fourth observation window T4 between the instants $t_G$ and $t_H$ during the closing manoeuvre of the switching apparatus 1 may be selected (step 152 of the comparison procedure 150).

Additionally, first and second curves $C_{Iv}$, $C_{Av}$ respectively indicative of the ideal and actual profile of the speed of the movable contacts 4 are selected (step 153 of the comparison procedure 150).

The selected first and second curves $C_{Iv}$, $C_{Av}$ are then compared at the selected observation time window T3 or T4 (step 154 of the comparison procedure 150).

In order to carry out such a comparison, corresponding fifth and sixth characteristic values $t_1$, $t_2$ of the first and second curve $C_{Iv}$, $C_{Av}$ are selected at the observation time window T3 or T4 (sub-steps 1541-1542 of the comparison step 154).

In this case, the fifth and fourth characteristic values $t_1$, $t_2$ are time quantities, namely the instants $t_1$ and $t_2$, at which the speed of the movable contacts 4 starts decreasing in the observation time windows T3 or T4.

A variation value $\Delta_3 = t_1 - t_2$ between the selected first and second characteristic values $t_1$, $t_2$ is then calculated (sub-step 1543 of the comparison step 154).

Such a variation value may be compared with a suitable threshold level.

A variation value $\Delta_3$ higher than such threshold level may be indicative of an excessive erosion condition of the electric contacts 3, 4 or of a wrong regulation condition of the actuation force provided by the compression springs of the electric poles 2.

Additionally, since the actual speed of the movable contacts 4 is known from the second curve $C_{Av}$, the variation value $\Delta_3$ allows even quantifying the consumed portions of the electric contacts 3, 4 due to erosion phenomena.

As the skilled person will certainly understand, additional operating parameters of the electric poles 2 may be suitably checked by means of the diagnostic procedure 100 in order to collect information about the operating conditions of one or more components of said electric poles.

As it is apparent from the above, in a further aspect the present invention relates to a diagnostic method 100 to check the operating condition of one or more components of the electric poles 2 of a medium voltage switching apparatus 1, as described above.

The diagnostic method 100, according to the invention, comprises the following steps:
- basing on the selectable ideal position curve $C_{IP}$, obtaining (reference step 101) one or more first curves $C_{Iv}$, $C_{IT}$ indicative of an ideal behaviour of the switching apparatus, during an opening manoeuvre or closing manoeuvre of the switching apparatus;
- basing on the detection signals $P_F$, $v_F$, $T_F$ provided by the second control arrangement 72, calculating (reference step 102) one or more second curves $C_{Av}$, $C_{AT}$ indicative of an actual behaviour of the switching apparatus, during an opening manoeuvre or closing manoeuvre of said switching apparatus;
- executing (reference step 103) a comparison procedure 150 among the first and second curves $C_{Iv}$, $C_{IT}$, $C_{Av}$, $C_{AT}$.

Preferably, the comparison procedure 150 comprises the following steps:
- selecting (reference step 151) an operating parameter of said electric poles to be checked;
- selecting (reference step 152) an observation time window T1, T2, T3, T4 to check said selected operating parameter;
- selecting (reference step 153) a first curve $C_{Iv}$, $C_{IT}$ and a corresponding second curve $C_{Av}$, $C_{AT}$ to check said selected operating parameter;
- comparing (reference step 154) the selected first curve $C_{Iv}$, $C_{IT}$ with the selected second curve $C_{Av}$, $C_{AT}$ at said selected observation time windows T1, T2, T3, T4;
- possibly (reference step 155) repeating the previous steps for another selectable operating parameter of said electric poles.

Preferably, the step 154 of comparing the selected first curve $C_{Iv}$, $C_{IT}$ with the selected second curve $C_{Av}$, $C_{AT}$ at a selected observation time window T1, T2, T3, T4 comprises the following sub-steps:
- selecting (reference sub-step 1541) a first characteristic value A1, A3, $t_1$ of the selected first curve $C_{Iv}$, $C_{IT}$;
- selecting (reference sub-step 1542) a second characteristic value A2, A4, $t_2$ of the selected second curve $C_{Av}$; $C_{AT}$ corresponding to the selected first characteristic value;
- calculating (reference sub-step 1543) a variation value $\Delta_1$, $\Delta_2$, $\Delta_3$ between the corresponding selected first and second characteristic values.

The present invention provides remarkable advantages with respect to known solutions of the state of the art.

The diagnostic method 100 carried out by the control unit 7 allows collecting information to check the operating conditions of one or more components of the electric poles 2 without employing dedicated sensors.

In fact, the diagnostic method 100 provides for suitably processing detection signals $P_F$, $v_F$, $T_F$ that are already available to the control unit 7 as these detection signals are those suitably processed by the second control arrangement 72 to carry out the closed-loop control functionalities described above.

In practice, the diagnostic method 100 employs the second control arrangement 72, which is adapted to provide closed-loop control functionalities, as a source capable of providing detection signals $P_F$, $v_F$, $T_F$ suitable for obtaining information on the operating conditions of one or more components of the electric poles 2.

The above-described capabilities of the control unit 7 allow providing advanced management functionalities of the switching apparatus 1 without a remarkable increase of size and/or complexity of this latter.

The switching apparatus 1, according to the invention, is characterised by high levels of reliability for the intended applications.

The switching apparatus 1, according to the invention, is of relatively easy and cheap industrial production and installation on the field.

The invention claimed is:

1. A control unit for a medium voltage switching apparatus, wherein said switching apparatus comprises one or more electric poles, each electrically coupleable with a corresponding electric line, said switching apparatus comprising:
  for each electric pole, a fixed contact and a movable contact, said movable contact being reversibly movable between a decoupled position from said fixed contact and a coupled position with said fixed contact, said movable contact moving from said decoupled position to said coupled position during a closing manoeuvre of the switching apparatus and moving from said coupled position to said decoupled position during an opening manoeuvre of the switching apparatus;
  a servomotor unit including at least one servomotor and adapted to provide a servomotor status signal indicative of an angular position of said at least one servomotor; and
  a motion transmission assembly adapted to mechanically couple said servomotor unit with the movable contact of said one or more electric poles;
  wherein said control unit is adapted to carry out a diagnostic to check operating conditions of one or more components of said electric poles the control unit adapted to:
    basing on a selectable ideal position curve, obtain one or more first curves indicative of an ideal behaviour of said switching apparatus, during the opening manoeuvre or the closing manoeuvre of the switching apparatus;

basing on detection signals provided by a closed-loop control arrangement of said control unit by processing said servomotor status signal, calculate one or more second curves indicative of an actual behaviour of said switching apparatus, during the opening manoeuvre or the closing manoeuvre of said switching apparatus; and carry out a comparison procedure among said one or more first curves and the one or more second curves.

2. The control unit, according to claim 1, wherein said comparison procedure comprises:
selecting an operating parameter of said electric poles to be checked;
selecting an observation time window to check said selected operating parameter;
selecting a first curve and a second curve to check said selected operating parameter; and
comparing the selected first curve with the selected second curve at said selected observation time window.

3. The control unit, according to claim 2, wherein comparing the selected first curve with the selected second curve at said selected observation time window comprises:
selecting a first characteristic value of the selected first curve;
selecting a second characteristic value of the selected second curve; and
calculating a variation value between corresponding selected first and second characteristic values.

4. The control unit, according to claim 3, wherein said one or more first curves are indicative of ideal profiles of speed and actuation force of said movable contact during the opening manoeuvre or the closing manoeuvre of the switching apparatus.

5. The control unit, according to claim 3, wherein said one or more second curves are indicative of actual profiles of speed and actuation force of said movable contact during the opening manoeuvre or the closing manoeuvre of the switching apparatus.

6. The control unit, according to claim 2, wherein said one or more first curves are indicative of ideal profiles of speed and actuation force of said movable contact during the opening manoeuvre or the closing manoeuvre of the switching apparatus.

7. The control unit, according to claim 6, wherein said one or more second curves are indicative of actual profiles of speed and actuation force of said movable contact during the opening manoeuvre or the closing manoeuvre of the switching apparatus.

8. The control unit, according to claim 2, wherein said one or more second curves are indicative of actual profiles of speed and actuation force of said movable contact during the opening manoeuvre or the closing manoeuvre of the switching apparatus.

9. The control unit, according to claim 8, further comprising a first control arrangement adapted to provide a position reference signal indicative of a reference position for said movable contact, said first control arrangement calculating said position reference signal basing on said ideal position curve indicative of a desired position profile for said movable contacts, during the opening manoeuvre or the closing manoeuvre of the switching apparatus.

10. The control unit, according to claim 1, further comprising a first control arrangement adapted to provide a position reference signal indicative of a reference position for said movable contact, said first control arrangement calculating said position reference signal basing on said ideal position curve indicative of a desired position profile for said movable contact, during the opening manoeuvre or the closing manoeuvre of the switching apparatus.

11. The control unit, according to claim 10, further comprising a second control arrangement adapted to receive said position reference signal and said servomotor status signal and provide a servomotor regulation signal to control an operation of said servomotor unit, said second control arrangement calculating said servomotor regulation signal basing on said position reference signal and on detection signals indicative of an actual behaviour of said movable contact, during the opening manoeuvre or the closing manoeuvre of the switching apparatus, said second control arrangement calculating said detection signals by processing said servomotor status signal.

12. The control unit, according to claim 11, said control unit comprises a third control arrangement adapted to receive said position reference signal and provide an adjustment signal to adjust one or more regulation signals calculated by said second control arrangement, said third control arrangement calculating said adjustment signal basing on said position reference signal.

13. The control unit, according to claim 11, wherein said second control arrangement comprises:
a first closed-loop control module adapted to:
receive said position reference signal and said servomotor status signal;
calculate a position detection signal indicative of an actual position of said movable contact basing on said servomotor status signal;
calculate a position error signal basing on said position reference signal and said position detection signal; and
calculate a speed reference signal indicative of a reference speed for said movable contact basing on said position error signal;
a second closed-loop control module adapted to:
receive said speed reference signal and an angular position detection signal;
calculate a speed detection signal indicative of the actual speed of said movable contact basing on said servomotor status signal;
calculate a speed error signal basing on said speed reference signal and a speed feedback signal; and
calculate a first actuation force reference signal indicative of a reference actuation force to be exerted on said movable contact basing on said speed error signal; and
a third closed control loop adapted to:
receive said first actuation force reference signal, said angular position detection signal and an adjustment signal;
calculate a second actuation force reference signal indicative of a reference actuation force for said movable contact basing on said first actuation force reference signal and said adjustment signal;
calculate an actuation force detection signal indicative on the actual actuation force exerted on said movable contact basing on said servomotor status signal;
calculate an actuation force error signal basing on said second actuation force reference signal and said actuation force detection signal; and
calculate said servomotor regulation signal basing on said actuation force error signal;
during the opening manoeuvre or the closing manoeuvre of the switching apparatus.

14. The control unit, according to claim 11, wherein said second control arrangement comprises:

a fourth closed-loop control module adapted to:
  receive said position reference signal and said servomotor status signal;
  calculate a position detection signal indicative of the actual position of said movable contact basing on said servomotor status signal;
  calculate a position error signal basing on said position reference signal and said position detection signal; and
  calculate a first speed reference signal indicative of a reference speed for said movable contact basing on said position error signal; and
a second closed-loop control module adapted to:
  receive said first speed reference signal and an angular position detection signal;
  calculate a second speed reference signal indicative of a reference speed for said movable contact basing on said first speed reference signal and an adjustment signal;
  calculate a speed detection signal indicative of the actual speed of said movable contact basing on said servomotor status signal;
  calculate a speed error signal basing on said second speed reference signal and a speed feedback signal; and
  calculate said servomotor regulation signal basing on said speed error signal;
during the opening manoeuvre or the closing manoeuvre of the switching apparatus.

15. The control unit, according to claim 10, wherein said first control arrangement is adapted to select an ideal position reference curve from a set of predefined ideal position curves stored in a library.

16. The control unit, according to claim 10, wherein said first control arrangement is adapted to carry out said diagnostic.

17. A medium voltage switching apparatus comprising a control unit, according to claim 1.

18. A diagnostic method to check operating conditions of one or more components of one or more electric poles of a medium voltage switching apparatus,
wherein said switching apparatus comprises said electric poles, each electrically coupleable with a corresponding electric line,
wherein said switching apparatus further comprises:
  for each electric pole, a fixed contact and a movable contact, said movable contact being reversibly movable between a decoupled position from said fixed contact and a coupled position with said fixed contact, said movable contact moving from said decoupled position to said coupled position during a closing manoeuvre of the switching apparatus and moving from said coupled position to said decoupled position during an opening manoeuvre of the switching apparatus;
  a servomotor unit including at least one servomotor and adapted to provide a servomotor status signal indicative of an angular position of said at least one servomotor;
  a motion transmission assembly adapted to mechanically couple said servomotor unit with the movable contact of said one or more electric poles; and
  a control unit to control an operation of said switching apparatus, the diagnostic method comprising:
  basing on a selectable ideal position curve, obtaining one or more first curves indicative of an ideal behaviour of said switching apparatus, during the opening manoeuvre or the closing manoeuvre of the switching apparatus;
  basing on detection signals provided by a closed-loop control arrangement of said control unit by processing said servomotor status signal, calculating one or more second curves indicative of an actual behaviour of said switching apparatus, during the opening manoeuvre or the closing manoeuvre of said switching apparatus; and
  carrying out a comparison procedure among said one or more first curves and the one or more second curves.

19. The diagnostic method, according to claim 18, wherein said comparison procedure comprises:
  selecting an operating parameter of said electric poles to be checked;
  selecting an observation time window to check said selected operating parameter;
  selecting a first curve and a second curve to check said selected operating parameter; and
  comparing the selected first curve with the selected second curve at said selected observation time window.

20. The diagnostic method, according to claim 19, wherein said comparing the selected first curve with the selected second curve at said selected observation time window comprises:
  selecting a first characteristic value of the selected first curve;
  selecting a second characteristic value of the selected second curve; and
  calculating a variation value between corresponding selected first and second characteristic values.

* * * * *